(12) United States Patent
Su et al.

(10) Patent No.: US 7,346,867 B2
(45) Date of Patent: Mar. 18, 2008

(54) METHOD FOR ESTIMATING PROPAGATION NOISE BASED ON EFFECTIVE CAPACITANCE IN AN INTEGRATED CIRCUIT CHIP

(75) Inventors: Haihua Su, Austin, TX (US); David J. Widiger, Pflugerville, TX (US); Ying Liu, Austin, TX (US); Byron L. Krauter, Round Rock, TX (US); Chandramouli V. Kashyap, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 437 days.

(21) Appl. No.: 11/048,422

(22) Filed: Feb. 1, 2005

(65) Prior Publication Data
US 2006/0190881 A1   Aug. 24, 2006

(51) Int. Cl.
G06F 17/50 (2006.01)
(52) U.S. Cl. .................. 716/4; 716/5; 716/6
(58) Field of Classification Search ................ 716/4–6
See application file for complete search history.

(56) References Cited

U.S. PATENT DOCUMENTS 6,499,131 B1 * 12/2002 Savithri et al. ................ 716/5
6,523,149 B1 * 2/2003 Mehrotra et al. ............... 716/4
6,594,805 B1 * 7/2003 Tetelbaum et al. ............. 716/5
7,024,337 B2 * 4/2006 Yoda .......................... 702/183
2003/0079191 A1 * 4/2003 Savithri et al. ................ 716/4
2006/0107245 A1 * 5/2006 Chakraborty et al. .......... 716/5
2006/0112359 A1 * 5/2006 Becer et al. .................... 716/6

* cited by examiner

Primary Examiner—Paul Dinh
(74) Attorney, Agent, or Firm—H. Daniel Schnurmann

(57) ABSTRACT

A system and method for estimating propagation noise that is induced by a non-zero noise glitch at the input of the driver circuit. Such propagation noise is a function of both the input noise glitch and the driver output effective capacitive load, which is typically part of the total wiring capacitance due to resistive shielding in deep sub-micron interconnects. The noise-driven effective capacitance solution provided herein also estimates the propagation noise induced by a non-zero noise glitch at the input of the driving gate. Gate propagation noise rules describing a relationship between the output noise properties and the input noise properties and the output loading capacitance are used within the noise-driven effective capacitance process to determine the linear Thevenin model of the driving gate. The linearized Thevenin driver model is then employed to analyze both the propagation noise and the combined coupling and propagation noise typically seen in global signal nets.

13 Claims, 9 Drawing Sheets

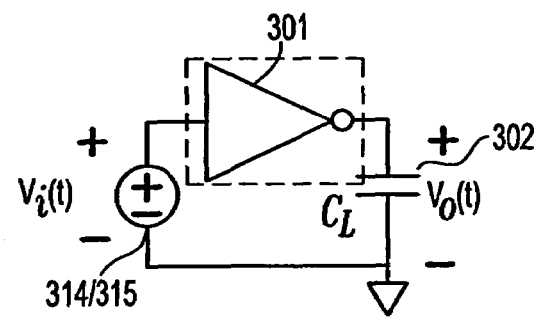
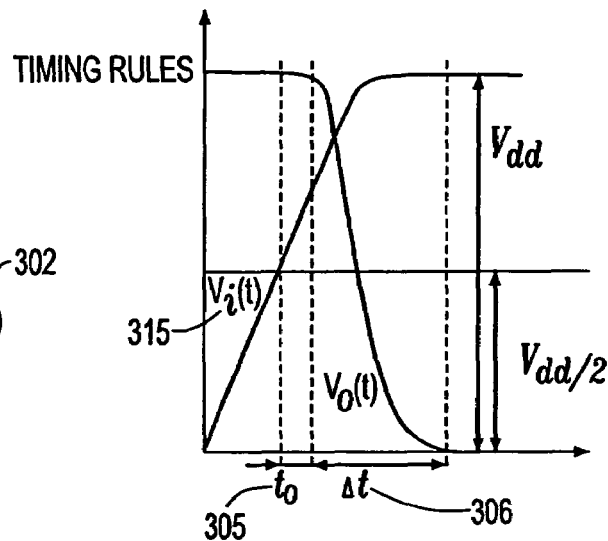
FIG. 3A
(PRIOR ART)
FIG. 3B
(PRIOR ART)
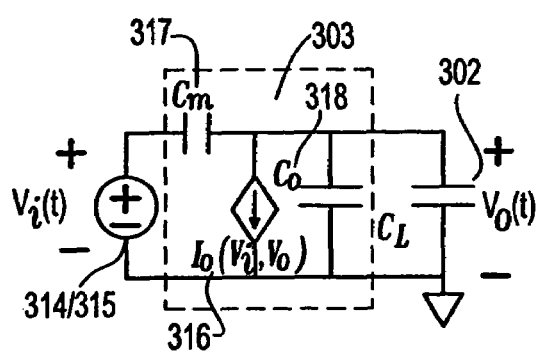
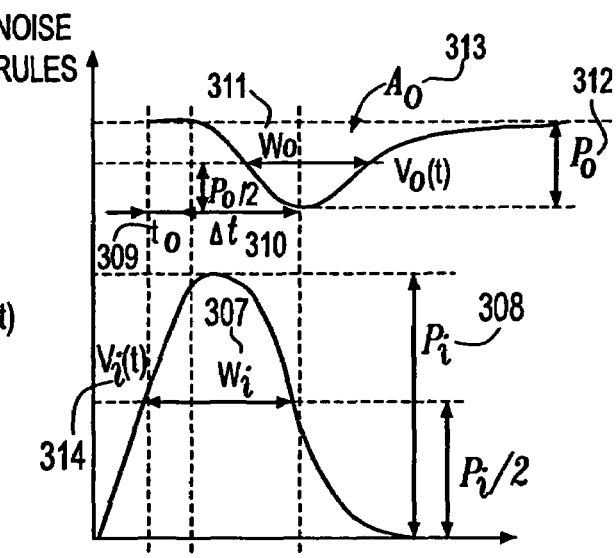
FIG. 3C
(PRIOR ART)
FIG. 3D
(PRIOR ART)

METHOD FOR ESTIMATING PROPAGATION NOISE BASED ON EFFECTIVE CAPACITANCE IN AN INTEGRATED CIRCUIT CHIP

BACKGROUND OF THE INVENTION

The present invention relates to the design of integrated circuit chips, and more particuarly, to a method and a system for improving the accuracy of existing noise analysis tools in order to identify wires susceptible to noise problems such that other tools can resolve the noise problems in the design.

The continuous scaling of CMOS processes has lead to an increase of noise in digital integrated circuits (ICs). Noise glitches that propagate to a dynamic node or storage element (e.g., a latch) can alter the state of the circuit. This type of noise is often called functional noise. There are two types of noise glitches in a victim net. The first one is coupling noise, which refers to the noise due to the switching of the neighboring nets (referred hereinafter as aggressor nets) that are coupled to the victim net via coupling capacitances or coupling inductances. The second one is referred to propagation noise, which comes from an existing glitch at the input of the victim driver.

To gain a better understanding of the problem addressed by the invention, reference is made to FIG. 1 that graphically illustrates the coupling noise and the propagation noise. The two sources of functional noise are shown occurring in victim net 102. The first one is the aforementioned propagation noise, which is induced by an existing glitch at the input of the victim driver. The second, is the previously mentioned coupling noise, also known as crosstalk noise, which is caused by the simultaneous switching of aggressor net(s) 103 capacitively or inductively coupled to the victim net 102. When the aggressor net 103 is not switching, only propagation noise is seen at the victim net 102. When the arrivals of the aggressor switching signal 110 and the victim input noise pulse 114 are aligned with each other, the combined propagation and coupling noise, e.g., 106, 107, 108, will show in victim net 102. Because of the non-linearity of the victim driver 100, the combined propagation and coupling noise is typically much higher than a superposition of each individual noise. Therefore the victim driver modeling is of particular importance.

It is usually impractically slow to directly analyze the global signal net shown in FIG. 1 using a non-linear circuit analyzer. In order to determine the worst-case noise peak at the input of each victim receiver (e.g. 104), the same circuit has to be re-analyzed with different alignments of arrival times of the aggressor switching signal 110 and the victim input noise glitch 114, which is formidable.

Non-zero noise at both the input and output of the victim driver often makes the gate display a strong non-linear behavior. Therefore, the victim driver must be carefully modeled to ensure a correct functional noise analysis.

Two general approaches have been proposed for modeling the victim driver and the worst-case noise analysis. In the first approach, the victim driver is linearized while keeping the overall aggressor and victim circuit a linear system. The worst-case peak noise alignment between the victim and aggressors are obtained using superposition, which requires having the entire circuit analyzed only once. However, it is rather challenging to model the non-linear behavior of a gate using a simple linear model. By way of example, an extremely simple linear model can consist of only a load independent noise pulse and a driver quiet holding resistance. Such an approach typically introduces a considerable amount of error. It has been reported that for a 130 nm technology, the simplified flow underestimates the noise peak by as much as 70%. The second approach characterizes the driver using a simplified non-linear behavioral model. It consists of a non-linear voltage dependent DC current source and parasitic capacitors. To analyze such a model, a fast non-linear transient analysis engine with numerical integration techniques is employed. One limitation of such a behavioral model is that it works well only for single stage gates. Moreover, the introduction of the non-linear model in the circuit makes the worst-case peak alignment between the victim and aggressors costly. The alignment must be achieved iteratively, and in each iteration, a non-linear analysis of the behavioral model along with the entire interconnect circuit needs to be performed.

Another method that has been reported falls into the first category of computing a linear Thevenin model for the victim driver. To improve the accuracy, the computation of the linear victim driver parameters involves matching the linear driver current to the non-linear current through the interconnect driven by the non-linear behavioral model which, by nature, limits this approach to single-stage driving gates. Additionally, in this model, several Thevenin model parameters, such as the Thevenin resistance and Thevenin voltage pulse width are empirically chosen. However, this approach raises concerns in the computational cost of the model parameters.

Therefore, there is a need in industry for a better approach for determining a linear victim driver model whose model parameters are easy to compute, which is convenient for worst-case noise alignment and which is fully integratable with existing industry standard cell libraries.

OBJECTS AND SUMMARY OF THE INVENTION

Accordingly, it is an object of the invention to improve the accuracy of existing noise analysis tools in order to identify wires susceptible to noise problems such that other tools can solve the noise problems in the design.

It is another object of the invention to minimize the increase in run time of the noise analysis tool while executing a more accurate analysis.

It is yet another object of the invention to improve and accurately predict signal integrity issues in high performance digital integrated circuits.

These and other objects, aspects and advantages of the invention are achieved by a method for estimating propagation noise that is induced by a non-zero noise glitch at the input of the driver circuit. Such propagation noise is a function of both the input noise glitch and the driver output effective capacitive load, which is typically part of the total wiring capacitance due to resistive shielding in deep submicron interconnects.

The present invention provides further a noise-driven effective capacitance solution for estimating propagation noise induced by a non-zero noise glitch at the input of the driving gate. Gate propagation noise rules describing a relationship between the output noise properties and the input noise properties and the output loading capacitance are used within the noise-driven effective capacitance process to determine the linear Thevenin model of the driving gate. The noise rules are either pre-characterized as a look-up table using SPICE or analyzed using a simple non-linear behavioral model of the gate. The linearized Thevenin driver model is then employed to analyze both the propagation noise and the combined coupling and propagation noise typically seen in global signal nets. The present invention extends a conventional timing driven effective capacitance method into the noise domain. Similar to the effective capacitance method in timing analysis which is widely used in industry timing tools, this approach provides a successful mechanism for separating the non-linear driver analysis from the linear interconnect analysis. In addition, the linear driver model maintains the linear property of the overall circuit, upon which superposition is applied to ease the task of finding the peak alignment of all the propagation and coupling noise sources.

This present invention extends the conventional timing-driven effective capacitance method into the noise domain. Similar to timing, gate propagation noise rules describe the relationship existing between the output noise properties, the input noise properties and the output loading capacitance for use within the noise-driven effective capacitance process. The noise rules are either precharacterized as a look-up table using SPICE or analyzed using a simple non-linear behavioral model of the gate. Through an effective capacitance methodology, a linear Thevenin model is constructed for the non-linear driver. The linear Thevenin model consists of one parameter for a resistor and four parameters for a triangular voltage source. These parameters are then calculated from the propagation noise rules.

The propagation noise in an interconnect is computed by convolving the Thevenin voltage source with the transfer function of the linear interconnect circuit. The same Thevenin model is employed to analyze propagation noise in the presence of coupling noise caused by the simultaneous switching of aggressor nets capacitively or inductively coupled to the victim net. The coupling and propagation noise peak alignment is trivially achieved by superposition. This approach works both accurately and efficiently for estimating the propagation noise and the combined propagation and coupling noise.

Additionally, the present invention provides a method for minimizing noise problems in a chip design, the chip design including at least one driver gate driving a victim net and sinks attached to the victim net, the method including the steps of: a) identifying noise at the inputs of the driver gate and computing the noise at the output thereof; b) propagating the computed noise at the output to all the sinks attached to the victim net; c) identifying nets coupled to the victim net and signal transitions on thecoupled nets, and computing the coupled noise for all the sinks attached to thevictim net; d) adding the computed propagation noise to the computed coupled noise; e) iteratively repeating steps a) to d) until a latch is reached; and f) determining if the noise at the latch input overlaps a signal clock, the overlap being indicative of a chip failure.

The foregoing discussion has outlined rather broadly the features and technical advantages of the present invention in order for the detailed description of the invention that follows to be better understood. Additional features and advantages of the invention will be described hereinafter.

BRIEF DESCRIPTION OF THE FIGURES

For a more complete understanding of the present invention and the advantages thereof, reference is now made to the following description of the invention taken in conjunction with the accompanying figures, in which:

FIG. 3 is a prior art diagram illustrating a noisy waveform versus a switching waveform;

DETAILED DESCRIPTION

In the following description, numerous specified details are set forth to provide a thorough understanding of the present invention.

Figure 1:
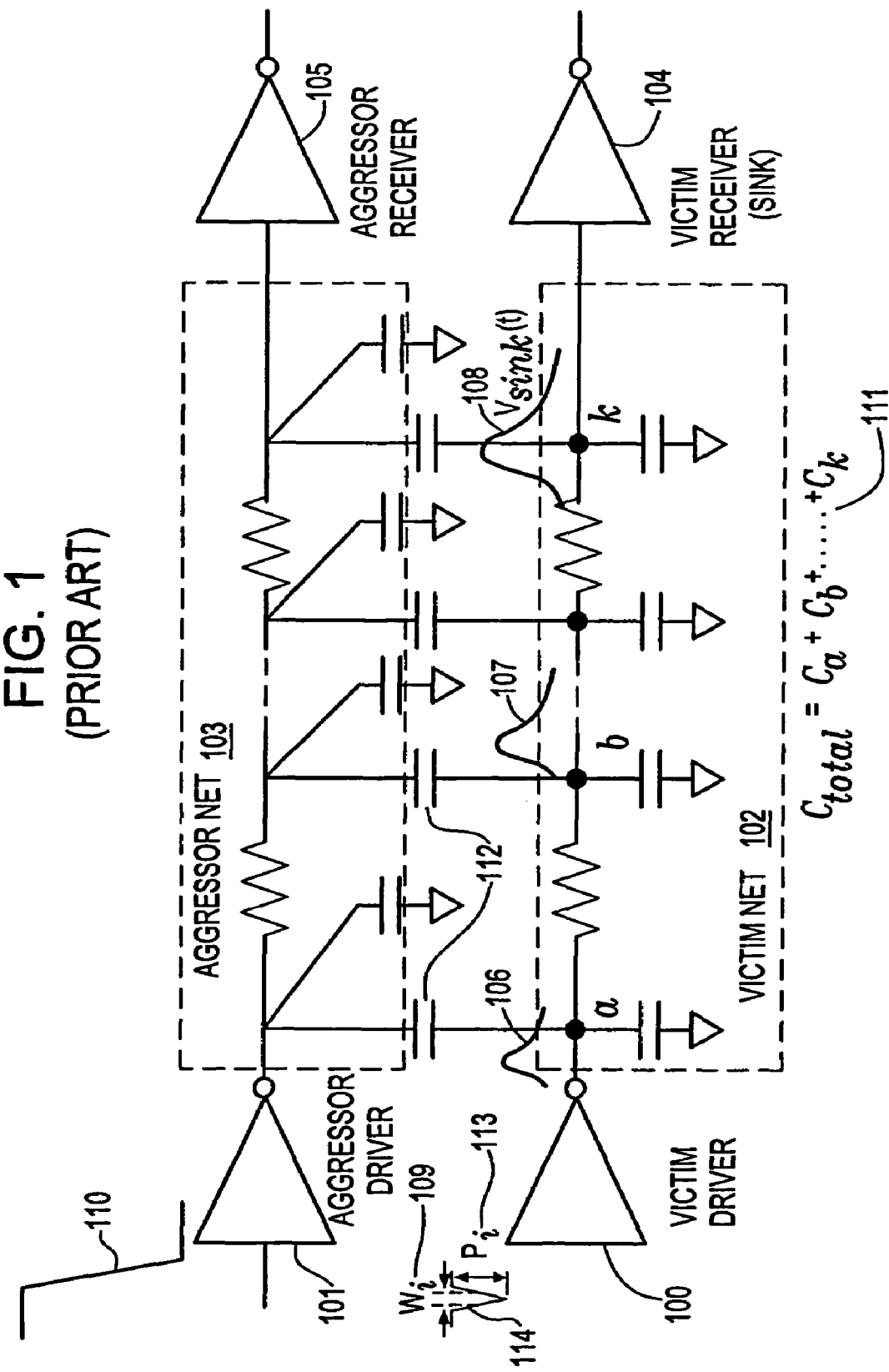
FIG. 1 is a prior art diagram illustrating coupling noise and propagation noise.
Figure 2:
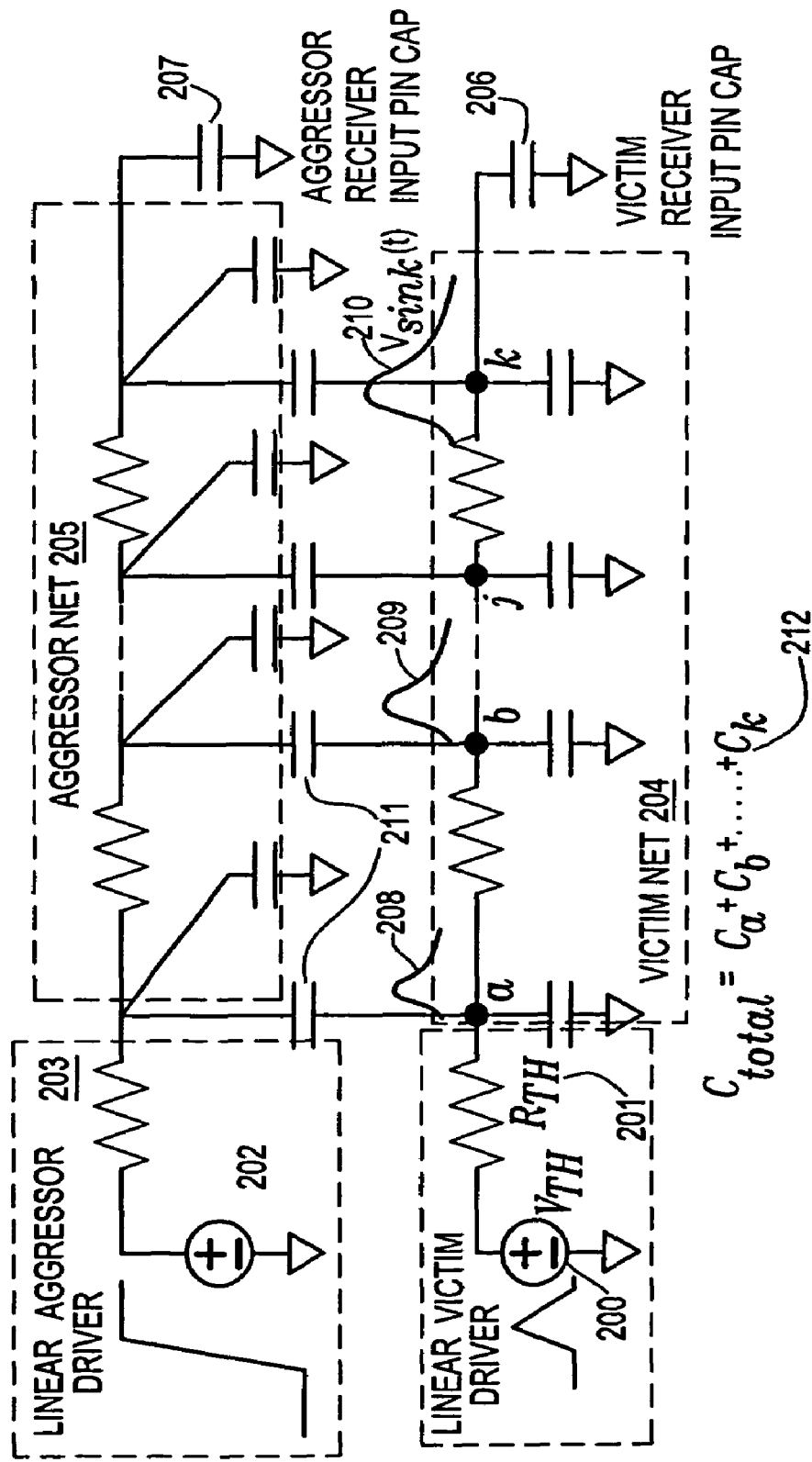
FIG. 2 is a prior art diagram illustrating a linear interconnect circuit for analyzing the combined coupling and propagation noise using linear drivers.

Referring to FIG. 2, the noise-driven effective capacitance method will now be described to construct a linear victim driver (including 200 and 201). Theoretically, the state-of-art timing driven effective capacitance method is applied to the aggressor net to find the linear aggressor driver model (including 202 and 203). In order to focus on the modeling of the victim driver in the preferred embodiment of the present invention, it is assumed that the fastest possible switching signal 202 and the smallest possible aggressor driver resistance 203 are present. This assumption is often used in practice for worst-case coupling noise analysis.

It is common practice in the industry to specify the switching waveform by way of parameters such as delay and rise time, commonly referred to as timing rules. No such universally accepted noise rules exist for noise waveforms. Unlike a timing/switching waveform, the noise waveform does not perform a complete single 0-to-Vdd (or Vdd-to-0) transition.

Shown in FIG. 3 are some of the parameters that specify the noise waveform that are required for the present invention. More specifically: FIG. 3(a) shows a sample circuit being analyzed for noise rules generation. FIG. 3(b) illustrates a simplified model for the circuit shown in FIG. 3(a). FIG. 3(c) depicts a typical timing waveform shown to distinguish between a noise waveform represented in FIG. 3(d). Finally, in FIG. 3(d) the noise waveform and various parameters of the noise waveform are specified in the noise rules. FIGS. 3(a)-3(d) will be explained hereinafter following a more detailed discussion of the method steps of the present invention.

Figure 4:
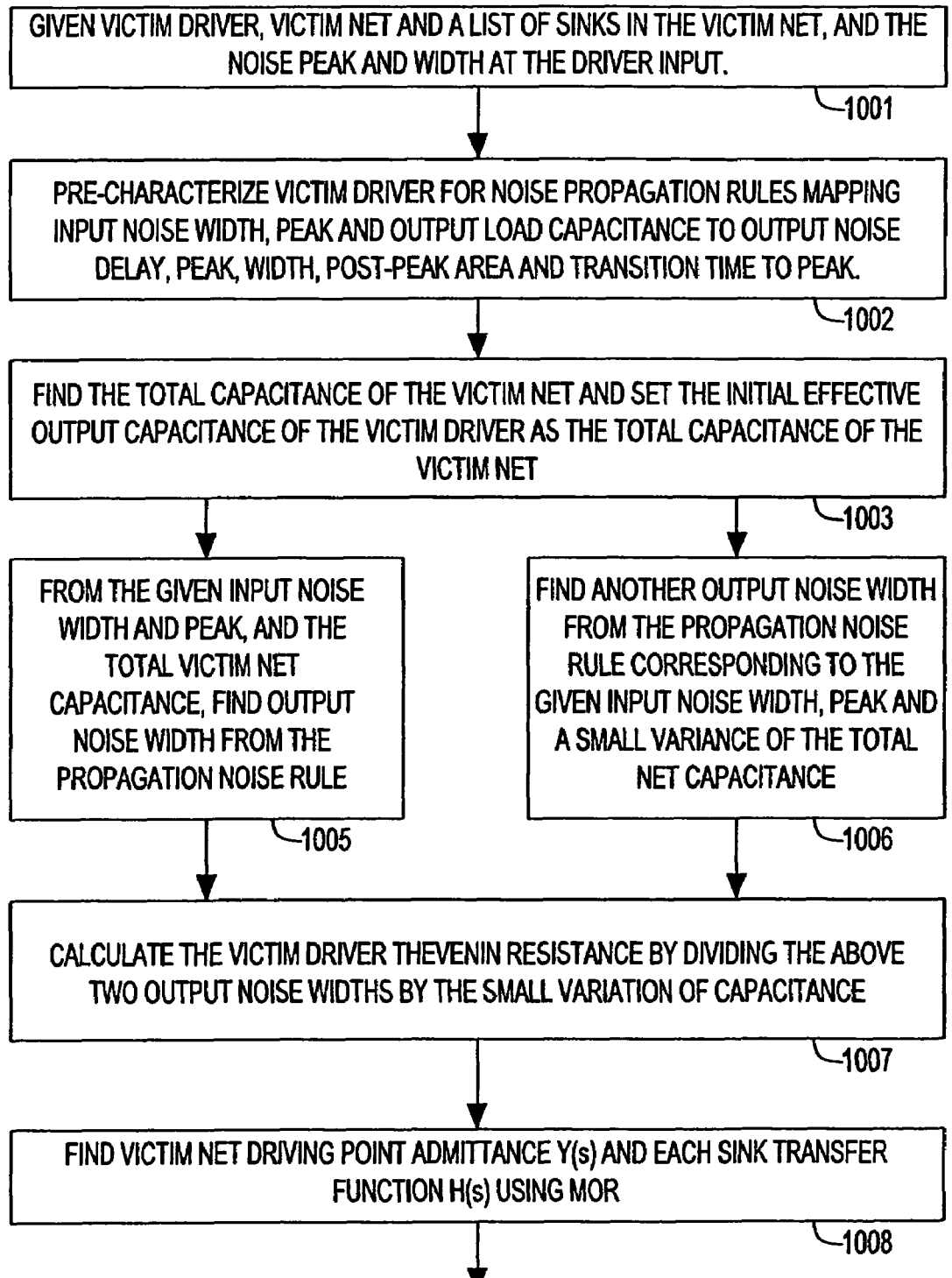
FIG. 4 is a detailed flow diagram of the method steps, expressed in generic form, according to the present invention.
Figure 4:
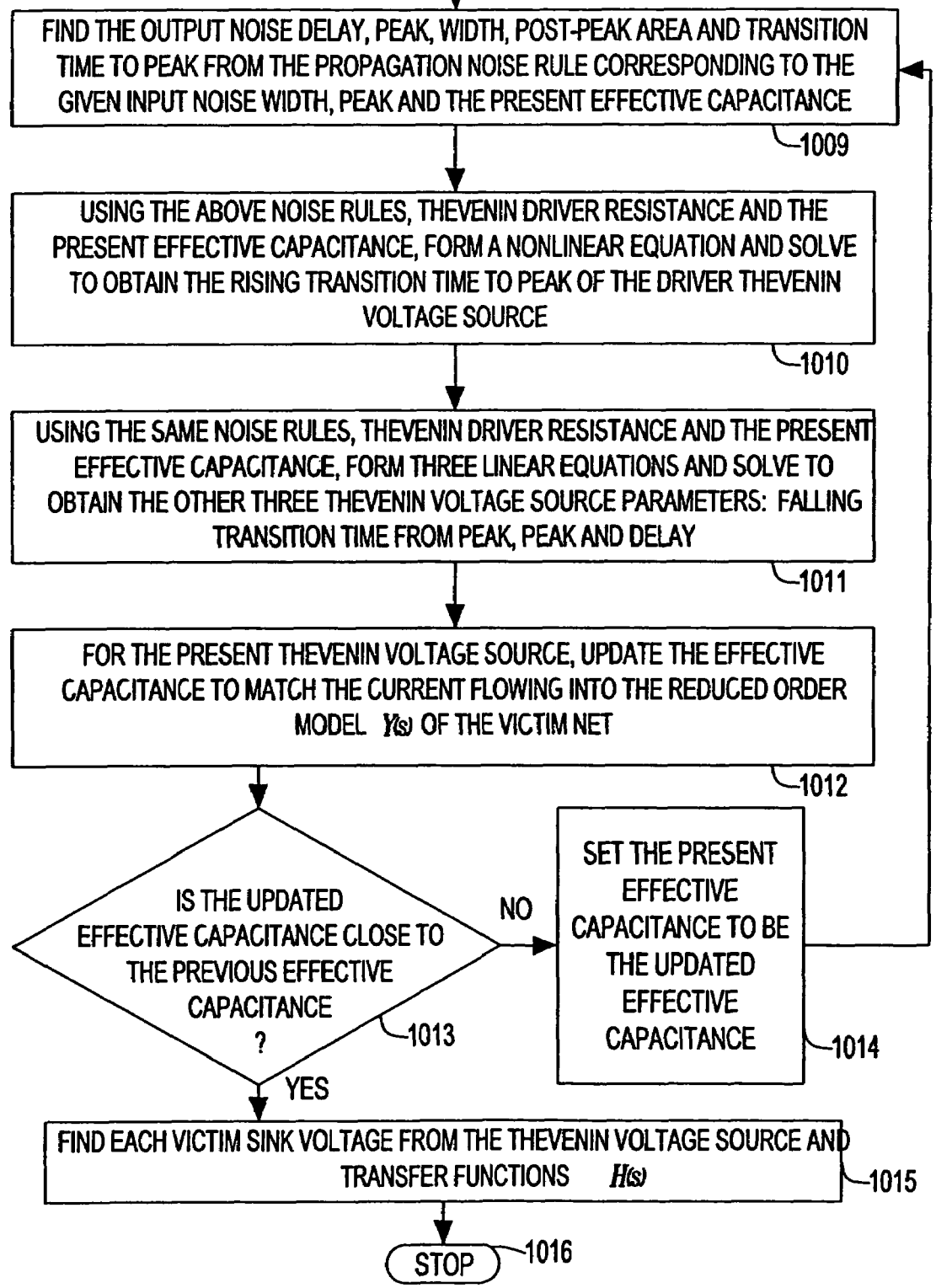

The overall flow of the noise-driven effective capacitance algorithm of the present invention is illustrated in FIG. 4.

In step 1001, a victim driver is shown driving a victim net, a list of sinks of the victim net to be analyzed based on the noise peak, and the width of the electrical signal as seen from the driver input which is provided. The victim driver is first analyzed using SPICE with a family of input noise pulse widths, peaks, output load capacitances and all the propagation noise rules listed in 1002 seen at the output of the driver, and which are stored in a table. The table facilitates calculating the propagated noise at the output of the gate as a function of the load capacitance connected to the gate output and the noise waveform at the gate input. Some of the specific parameters stored in the table are shown in the previously mentioned FIG. 3(*d*). This table is generated by simulating the circuit shown in FIG. 3(*b*) with various output load capacitances and different input noise waveforms. Once the table has been generated for the gate, it can be reused for all subsequent usages of this gate in the design.

The aforementioned rules are used in subsequent steps 1005, 1006, 1009, 1010 and 1011.

In step 1003, the total capacitance of the victim net is determined, and the effective capacitance at the driving point of the net to become the total capacitance is initialized.

In Steps 1005 and 1006, two output noise widths from the noise rule table corresponding to the given input noise peak and width and two output capacitances with a small amount of difference are extracted. The driver linear Thevenin resistance is calculated in step 1007 by dividing the output noise width variance by the small variance in output capacitance. For the victim net, the reduced order driving point admittance Y(s) and the transfer function H(s) of each victim sink are determined by way of any known model order reduction (MOR) techniques (Step 1008). The use of MOR is prompted in order to speed the run time. In step 1012, Y(s) computes the average current flowing into the victim net. In step 1015, the voltage waveform at each victim sink is calculated. The noise rules are determined in step 1009 and used along with the Thevenin driver resistance obtained in step 1007. The effective capacitance to form a non-linear equation is obtained and is solved to extract therefrom the driver Thevenin voltage source parameter of the rising transition time to peak (step 1010).

In step 1011, another three Thevenin voltage source parameters are solved by way of three linear equations formed with the same noise rules of step 1009 including the Thevenin driver resistance and the present effective capacitance. An actual Thevenin voltage source is then obtained. The average current flowing from the voltage source through the Thevenin resistance into the victim net does not necessarily coincide with the average current flowing from the same voltage source through the same Thevenin resistance into the effective capacitance. Therefore, the effective capacitance in step 1012 is updated in order to match the two average currents.

In step 1012, the convergence of the effective capacitance is checked. If the updated effective capacitance differs from the present effective capacitance, a second iteration is necessary. Thus, the actual capacitance becoming the updated effective capacitance is set (step 1014). The algorithm then branches back to step 1009. Otherwise, convergence of the effective capacitance is achieved and the algorithm steps forward to step 1015 to find the victim sink voltage from the Thevenin voltage source and the transfer function H(s). The process then comes to a stop at step 1016.

The aforementioned steps, which have been described generically with reference to FIG. 4, can also be expressed in mathematical form. Accordingly, detailed mathematical steps corresponding to the flow chart of FIG. 4 are shown in FIG. 5.

The input to the algorithm consists of noise width $W_i$ 109 and peak $P_i$ 113 at the victim driver input, wand an output consisting of a linear Thevenin voltage source $V_{TH}$ 200, Thevenin resistor $R_{TH}$ 201 and noise 210 at the receiver 104 inputs 206 (also known as sinks) of the net. The construction of the linear Thevenin model is based on an iterative effective capacitance process.

| | |
|---|---|
| Step 1003 | Step 2 |
| Step 1005, 1006, 1007 | Step 3 |
| Step 1008 | Step 4 |
| Step 1009 | Step 5 |
| Step 1010, 1011 | Step 6 |
| Step 1012 | Step 7 |
| Step 1013 | Step 8 |
| Step 1015 | Step 9 |
| Step 1016 | Step 10 |

Figure 5:
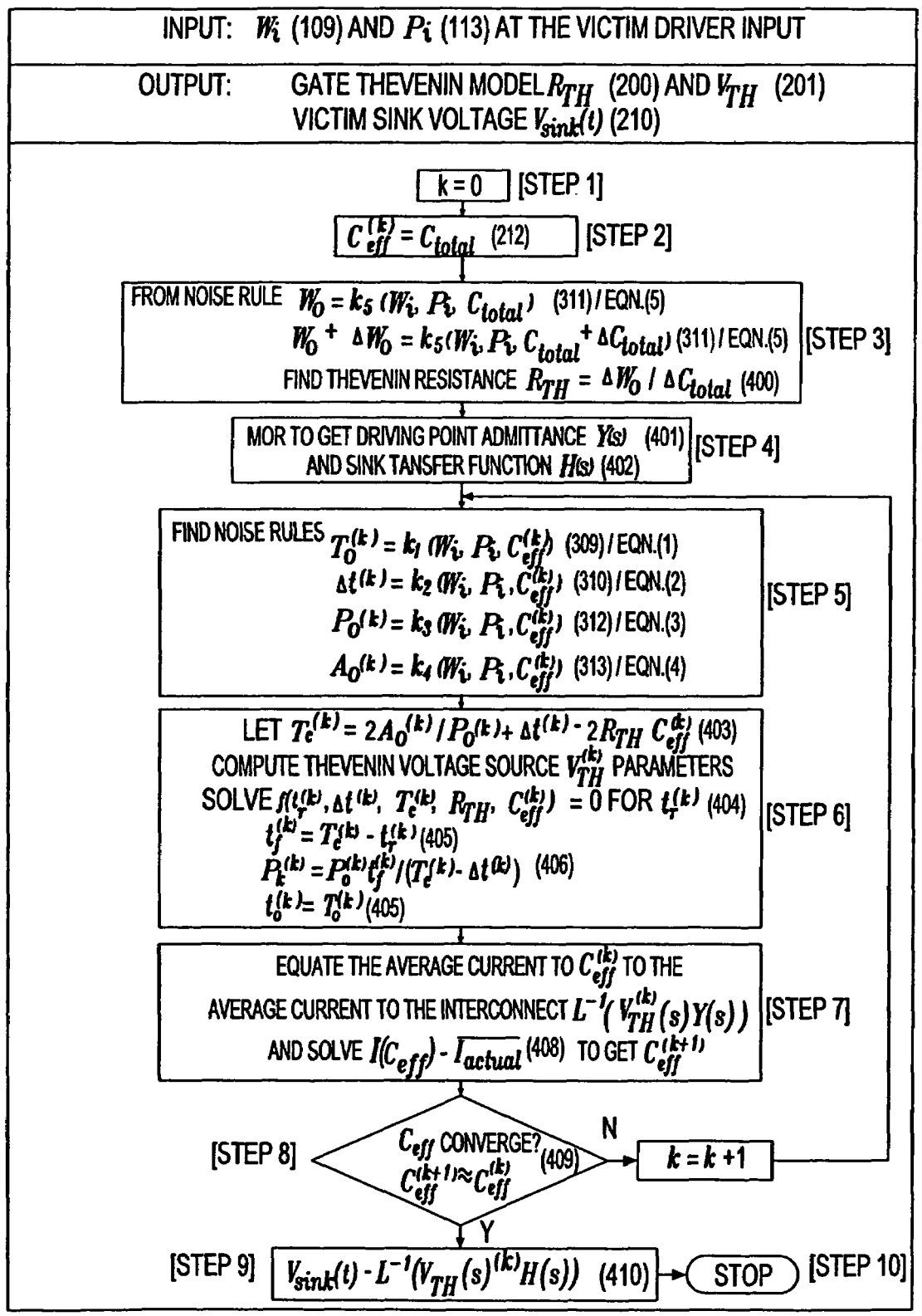
FIG. 5 is a flow diagram detailing the same method steps of the present invention illustrated in FIG. 4 expressed in mathematical form.

Steps mapping between FIGS. 4 and 5 is summarized above in tabular form. In general, convergence of a variable that is calculated in an iterative manner implies that the variable differs from the previously calculated value by a known, small percentage. In the present embodiment, victim driver Thevenin voltage source parameters are obtained by achieving convergence of the effective capacitance. Experiments show that a typical convergence of $C_{eff}$ is reached within a few iterations. More details on the algorithm shown in FIG. 5 follow hereinafter.

For any particular effective capacitance $C_{eff}$, the gate Thevenin model parameters (200 and 201) are constructed to match the gate propagation noise rules (309, 310, 311, 312 and 313) assuming a pure capacitive load of $C_L = C_{eff}$ (302). Next, for a fixed Thevenin driver, $C_{eff}$ 807 is updated so that the average current measured up to the noise peak arrival time is the same when driving either the pure effective capacitance $C_{eff}$ 807, a π model 801, or a reduced order model 802 of the interconnect. The pi-model is used to represent the load as seen by the driver when it is connected to an RC wire. Thus, the entire wire is reduced to a pi-model. However, for RLC wires or very long RC wires, the pi-model may not be sufficiently accurate. In such an instance, a higher order reduced model having more parameters for better accuracy is advantageously used. The reduced model is then converted to an "effective" capacitance using the inventive method. The reduced order model represents the original interconnect circuit using a reduced set of parameters. By way of example, four poles and residues are often sufficient to describe the response of an RC net consisting of a few thousand nodes.

The iterative process is sub-divided in two segments. In the first, the linear driver Thevenin model parameters are computed given a fixed effective capacitance $C_{eff}$. In the second, given the fixed linear driver Thevenin model, $C_{eff}$ is updated to match the average currents. Convergence of the algorithm will now be discussed.

Propagation noise rules are pre-characterized by analyzing each cell in the library (to be used as driving gates) by way of a family of input noise pulses 314 having a peak $P_i$ 308, a width $W_i$ 307 and a set of output loading capacitances $C_L$ 302 obtaining by running SPICE, and a general purpose circuit simulation program.

Referring back to FIG. 3(*a*), practitioners of the art will appreciate that for timing rule generation switching waveform 315 is to be applied to the gate input. In a similar manner, for noise rule generation, a noisy waveform 314 is applied to the input of the gate. Instead of timing properties such as delay 305 and slew 306, the output noise properties, specifically, the gate intrinsic noise delay $T_0$ 309, noise peak $P_o$ 312, noise transition time Δt 310, post-peak noise integral $A_o$ 313 and output noise width $W_o$ 311, are characterized.

The resulting noise rules are stored in a look-up table or fitted to form the noise rule equations similar to the k-factor timing rule equations:

$$T_0 = k_1(W_i, P_i, C_L) \quad (1)$$

$$\Delta t = k_2(W_i, P_i, C_L) \quad (2)$$

$$P_o = k_3(W_i, P_i, C_L) \quad (3)$$

$$A_o = k_4(W_i, P_i, C_L) \quad (4)$$

$$W_o = k_5(W_i, P_i, C_L) \quad (5)$$

It is worth noting that the complete input waveform is advantageously represented in three dimensions, i.e., its peak, rising transition time to peak, and falling transition time to peak. However, since the symmetry of the waveform is only a second order effect to the output noise, one may simplify the characterization by assuming symmetric input waveforms that are described by the width $W_i$ and peak $P_i$, where its rising transition time to peak equals its falling counterpart. Moreover, the noise rules described by Eqns. (1) to (5) include certain redundancies when representing the output noise waveform. For example, the smallest set of properties necessary for the overall computation may exclude Equations (1) and (4). A tradeoff must be made between the characterization time and the accuracy of the analysis. Alternatively, if a behavioral model of the gate is available, a fast non-linear analysis of the simple circuit is performed for calculating the output noise and, hence, the desired noise rules is determined on the fly. Noise rules generated in this fashion are no longer restricted to a symmetric input waveform.

FIG. 3(b) illustrates a behavioral model 303 consisting of a DC voltage dependent current source $I_o(V_i, V_o)$ 316, a miller capacitor $C_m$ 317 and an output capacitor $C_o$ 318. The pre-characterization of this model often requires a two-dimensional DC current table $I_o(V_i, V_o)$, a one-dimensional DC voltage transfer table $V_o(V_i)$ and the characterization of the miller and output capacitors.

Figure 6:
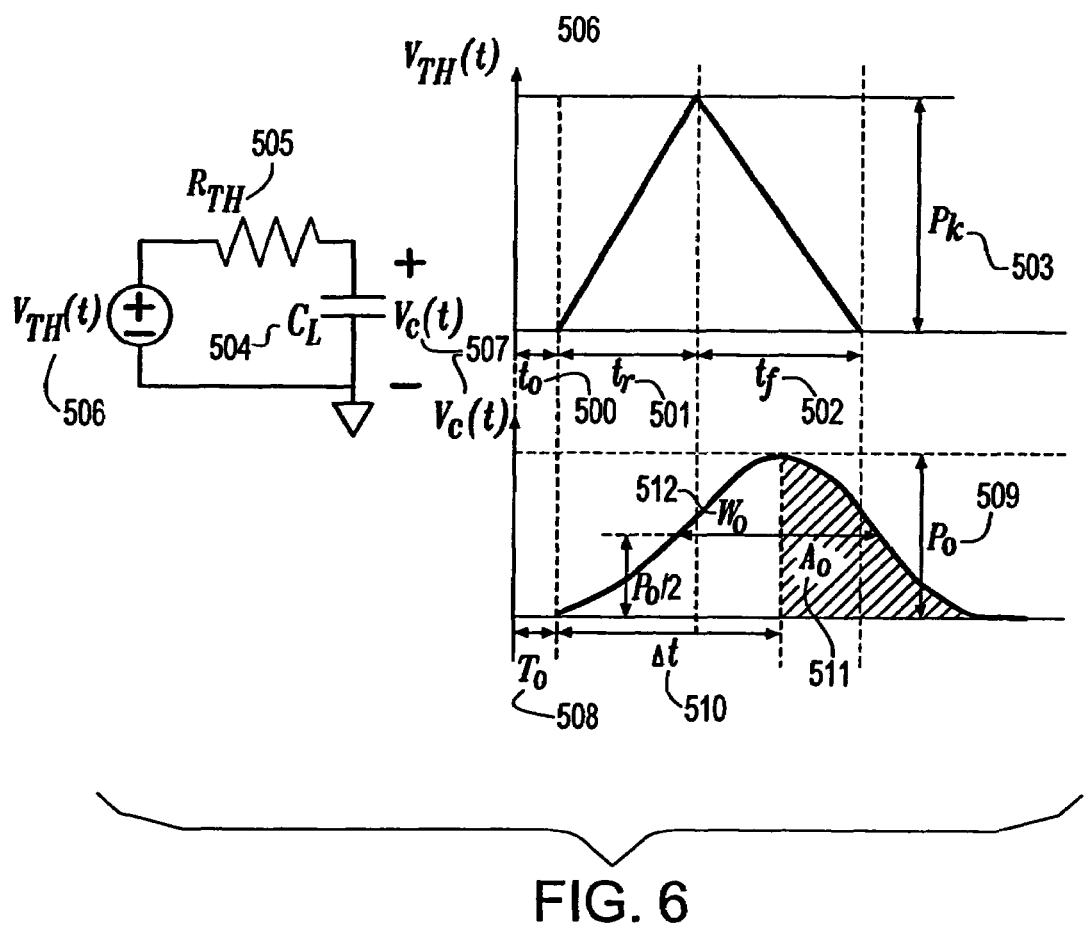
FIG. 6 is a diagram illustrating the conversion to a linear driver Thevenin model driving a load capacitance.

As previously described, the Thevenin voltage source is modeled using a time-varying triangular waveform having delay $t_o$ 500, rising transition time to peak $t_r$ 501, falling transition time from peak $t_f$ 502 and peak $P_k$ 503. Given an input noise pulse width $W_i$ 109, peak $P_i$ 113, and a specified load capacitance $C_L = C_{\text{eff}}$ 504, and a specified Thevenin resistance $R_{TH}$ 505, the gate Thevenin voltage source parameters 506 are selected to match the output waveform $V_c(t)$ 507 (shown in FIG. 6) whose key characteristics are represented by the propagation noise rules, i.e., gate intrinsic noise delay $T_0$ 508, noise peak $P_o$ 509, noise transition time to peak $\Delta t$ 510, post-peak noise integral $A_o$ 511, and output noise width $W_o$ 512. The delay $t_o$ 500 of the Thevenin voltage source is set to coincide with the gate intrinsic noise delay $T_0$ 508, i.e. $t_o = T_0$.

A theoretical derivation for calculating the linear Thevenin model parameters will now be discussed. To simplify the discussion, it is assumed that delay $t_0$ 500 is zero. $V_{TH}(t)$ 506 is written as $$P_k\left[\frac{1}{t_r}tu(t) - \left(\frac{1}{t_r} + \frac{1}{t_f}\right)(t - t_r)u(t - t_r) + \frac{1}{t_f}(t - t_r - t_f)u(t - t_r - t_f)\right] \quad (6)$$

The Laplace Transform of (6) is $$V_{TH}(s) = P_k\left[\frac{1}{t_r} - \left(\frac{1}{t_r} + \frac{1}{t_f}\right)e^{-t_r s} + \frac{1}{t_f}e^{-(t_r + t_f)s}\right]\frac{1}{s^2} \quad (7)$$

Let $R = R_{TH}$ and $C = C_{\text{eff}}$, $V_c(t)$ 507 is arrived at by taking the inverse Laplace Transform of $$V_c(s) = V_{TH}(s)\frac{1}{1 + sRC}:$$

$$V_c(t) = \begin{cases} P_k\dfrac{t - RC\left(1 - e^{-\frac{t}{RC}}\right)}{t_r}, & 0 \leq t \leq t_r \\[2mm] P_k\left[1 + \dfrac{RC + t_r}{t_f}\dfrac{t}{t_f} + \dfrac{RC}{t_r}e^{-\frac{t}{RC}} - \right. \\ \left. RC\left(\dfrac{1}{t_r} + \dfrac{1}{t_f}\right)e^{-\frac{t - t_r}{RC}}\right], & t_r \leq t \leq t_r + t_f \\[2mm] P_k RC\left[\dfrac{1}{t_r}e^{-\frac{t}{RC}} - \left(\dfrac{1}{t_r} + \right.\right. \\ \left.\left. \dfrac{1}{t_f}\right)e^{-\frac{t - t_r}{RC}} + \dfrac{1}{t_f}e^{-\frac{t - t_r - t_f}{RC}}\right], & t_r + t_f \leq t < \infty \end{cases} \quad (8)$$

Three parameters $t_r > 0$, $t_f > 0$ and $P_k > 0$ are selected to match the output noise rules as follows:

$$V_c(\Delta t) = P_o \quad (9)$$

$$V_c'(\Delta t) = 0 \quad (10)$$

$$A_o = \int_{\Delta t}^{\infty} V_c(t)dt \quad (11)$$

wherein Eqn (9) matches the output noise peak 509, Eqn (10) matches the output noise rising transition time to peak 510, and Eqn (11) matches the post peak noise area 511. Since the noise peak of $V_c(t)$ occurs between $t_r$ and $t_r + t_f$ i.e., $t_r \leq \Delta t \leq t_r + t_f$, the partial derivative of the second portion of $V_c(t)$ in Eqn. (8) is equated to zero to obtain $$-\frac{1}{t_f} - \frac{1}{t_r}e^{-\frac{\Delta t}{RC}} + \left(\frac{1}{t_r} + \frac{1}{t_f}\right)e^{-\frac{\Delta t - t_r}{RC}} = 0 \quad (12)$$

The output noise peak $P_o$ 509 is evaluated at $\Delta t$ 510 of the second portion of $V_c(t)$ $$P_o = P_k\left[1 + \frac{RC + t_r}{t_f} - \frac{\Delta t}{t_f} + \frac{RC}{t_r}e^{-\frac{\Delta t}{RC}} - \right. \quad (13)$$

$$\left. RC\left(\frac{1}{t_r} + \frac{1}{t_f}\right)e^{-\frac{\Delta t - t_r}{RC}}\right]$$

To match the post-peak noise integral $A_o$ 511, $V_c(t)$ is integrated from $\Delta t$ 510 to $\infty$:

$$A_o = \int_{\Delta t}^{\infty} V_c(t) dt \qquad (14)$$

$$= P_k \frac{(t_r + t_f - \Delta t)(t_r + t_f - \Delta t + 2RC) + 2(RC)^2}{2 t_f} +$$

$$P_k \frac{(RC)^2}{t_r} e^{-\frac{\Delta t}{RC}} - P_k (RC)^2 \left( \frac{1}{t_r} + \frac{1}{t_f} \right) e^{-\frac{\Delta t - t_r}{RC}}$$

By combining (12) and (13), Eqn. (13) is simplified to 406

$$P_o = P_k \frac{t_r + t_f - \Delta t}{t_f} \qquad (15)$$

Similarly, by feeding (12) into (14), Eqn. (14) is simplified to $$A_o = \frac{P_k}{2} \left( \frac{t_r - \Delta t}{t_f} + 1 \right) (t_r + t_f - \Delta t + 2RC) \qquad (16)$$

Combining (15) and (16), leads to 403 and 405

$$t_r + t_f = \frac{2 A_o}{P_o} + \Delta t - 2RC = T_c \qquad (17)$$

Eqn. (15) shows the relationship between the peak 503 of the Thevenin voltage and the peak 509 of the output noise waveform. Eqn. (17) reveals that the sum of $t_r$ 501 and $t_f$ 502 is constant, given the gate output waveform characteristics ($A_o$ 511, $P_o$ 509 and $\Delta t$ 510) as well as the values of R 505 and C 504.

Figure 7:
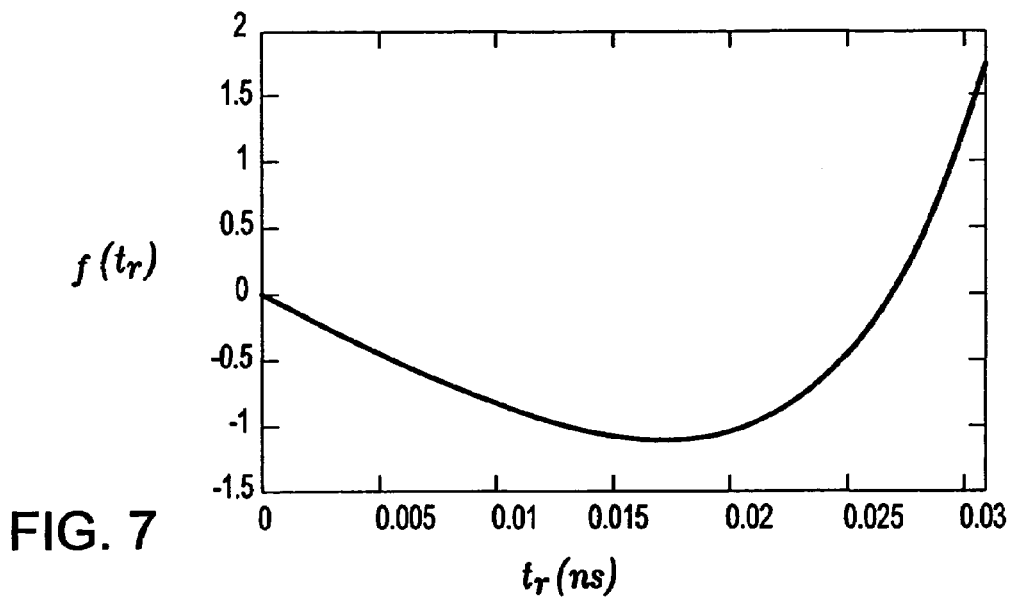
FIG. 7 is a diagram showing the rising transition time equation curve of the driver Thevenin voltage source.

Applying Eqn. (15) and (17) into (12), one obtains the following non-linear equation of $t_r$ 404:

$$f(t_r) = \left( 1 - e^{-\frac{\Delta t}{RC}} \right) t_r + T_c e^{\frac{t_r}{RC}} - T_c = 0 \qquad (18)$$

where $0 < t_r < T_c$. This equation is efficiently solved using Newton-Raphson, an iterative algorithm to solve a non-linear equation of f(x)=0, within a limited number of iterations. A typical portion of the $f(t_r)$ curve with $T_c$=0.063 ns, $\Delta t$=0.033 ns, R=36Ω and C=0.197 pF is shown in FIG. 7. The solution is found at $t_r$=0.027 ns.

Once $t_r$ 501 is computed, $t_f$ 502 and $P_k$ 503 is obtained from Eqn. (15) and Eqn. (17). Taking the partial derivative of Eqn. (17) with respect to C, one obtains 400

$$R = 0.5 \frac{\partial (2 A_o / P_o + \Delta t)}{\partial C} \approx \frac{\partial W_o}{\partial C} \qquad (19)$$

Figure 8:
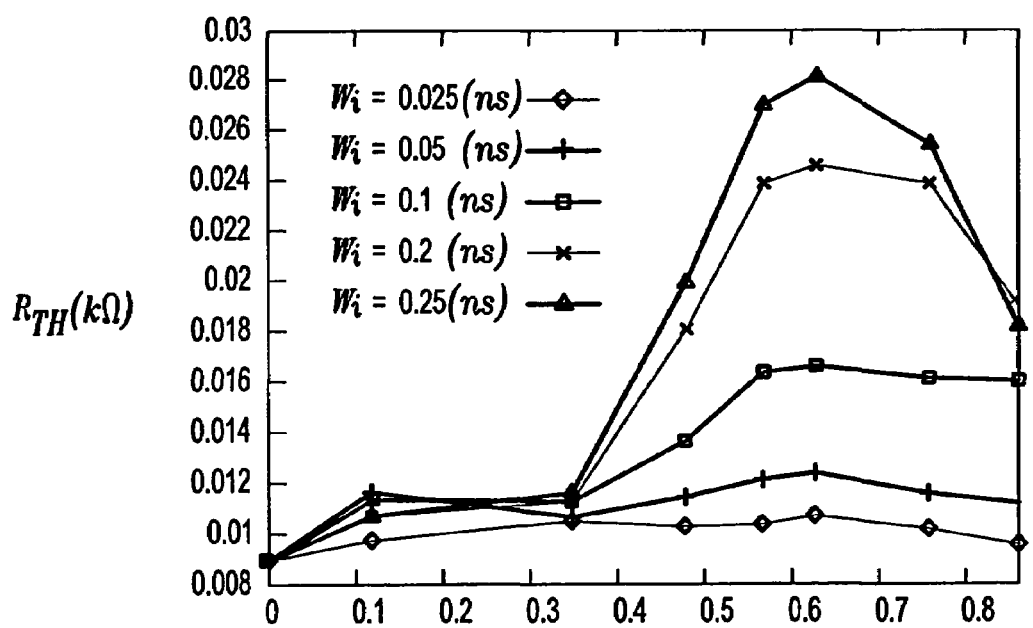
FIG. 8 is a diagram illustrating the sensitivity-based Thevenin driver resistance $R_{TH}$ of an inverter with respect to the input noise with various peaks and widths.

Eqn. (19) shows that the driver Thevenin resistance 505 is approximated by the sensitivity of the output noise pulse width 512 with respect to the output capacitance 504, which is obtained by querying the noise rule of $W_o$ 512 twice with two different capacitance values. Since a fixed value of $R_{TH}$ can provide the efficiency for only one model order reduction of the entire interconnect circuit (111 or 212), at every $C_{eff}$ iteration, one obtains $R_{TH}$ by calculating the sensitivity value only at $C_{eff}^{(0)}$ which is equal to the total wiring capacitance. The sensitivity based driver resistance as a function of input noise peak $P_i$ at various input noise widths $W_i$ for an inverter in a 0.13 μm technology, is shown in FIG. 8. Typically, the resistance value in the presence of an input noise pulse is higher than a quiet one. The coupling noise analysis using such a higher driver resistance often captures the non-linear effect of the gate.

It should be noted that the sensitivity based driver resistance in Eqn. (19) assumes a non-negligible output noise pulse with a finite pulse width. There are often cases when the non-zero input noise pulse is not sufficiently strong to cause a negligible output noise pulse. In such cases, the driver resistance is found from the DC load current table $I_o(V_i, V_o)$ and the DC voltage transfer table $V_o(V_i)$ by assuming an average input voltage level $V_i$.

Thus far, it is observed that the equations to compute the linear Thevenin model from the propagation noise rules have been derived, given an input noise pulse width $W_i$ 109 and peak $P_i$ 113 for a specified load capacitance $C_L$ 302. Described next, is how to update $C_{eff}$ through matching the average current flowing into the effective capacitance with that flowing into the actual interconnect circuit. Given the closed form formula for $V_{TH}(t)$ (Eqn. (6)) and $V_c(t)$ (Eqn. (8)), the current flowing into the effective capacitance 807 is written as $$I_{C_{eff}}(t) = \frac{V_{TH}(t) - V_c(t)}{R_{TH}} \qquad (20)$$

The average current is calculated as $$I_{avg}(C_{eff}) = \frac{1}{\Delta t} \int_0^{\Delta t} I_{C_{eff}}(t) dt \qquad (21)$$

By way of some mathematical manipulation, it is seen that $$I_{avg}(C_{eff}) = \frac{P_k}{\Delta t} \left\{ \frac{t_r + t_f - \Delta t}{t_f} C_{eff} + \right. \qquad (22)$$

$$\left. C_{eff}^2 \left[ \frac{R_{TH}}{t_f} + \frac{R_{TH}}{t_r} e^{-\frac{\Delta t}{R_{TH} C_{eff}}} - R_{TH} \left( \frac{1}{t_r} + \frac{1}{t_f} \right) e^{-\frac{\Delta t - t_r}{R_{TH} C_{eff}}} \right] \right\}$$

Figure 9:
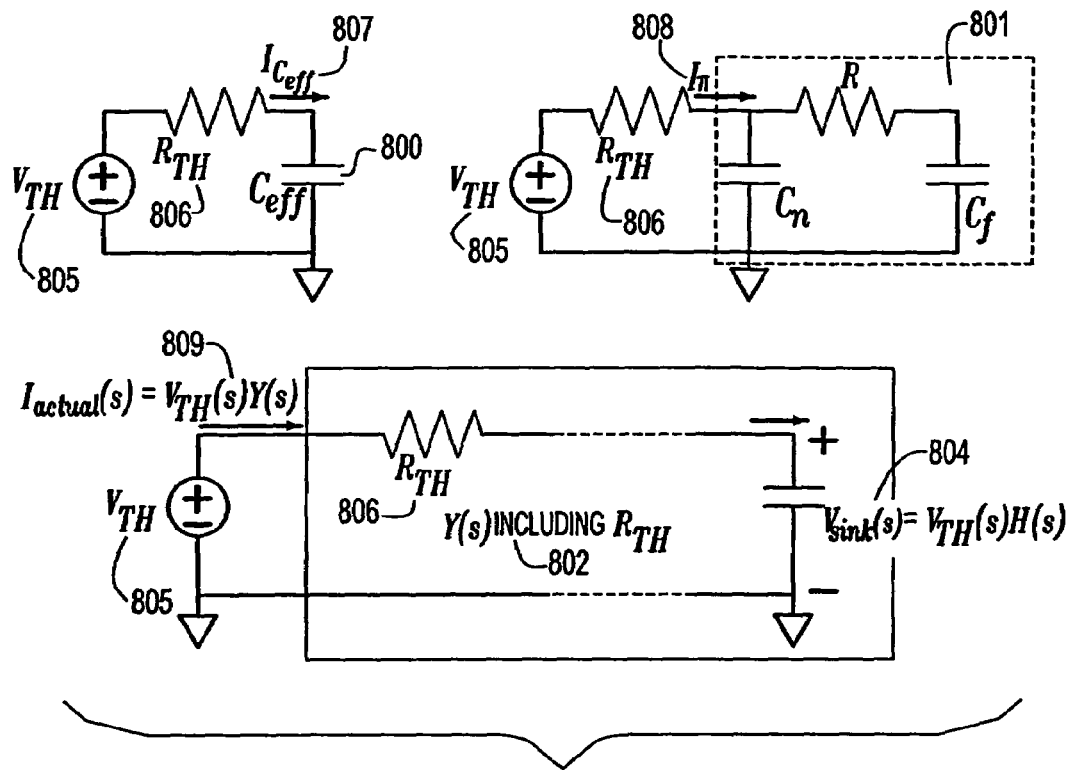
FIG. 9 is a diagram that illustrates the effective capacitance, π-model and higher reduced order model of the interconnect. The pi-model is used to represent the load as seen by the driver when it is connected to an RC wire.

The average current flowing into the actual interconnect circuit (808 or 809) is calculated using any known reduced order modeling technique. For instance, the pi-model 808 is an order-two model. The poles and residues of the admittance Y(s) 802 including the Thevenin resistance $R_{TH}$ (shown in FIG. 9) are obtained from model order reduction techniques such as AWE, SyPVL and PRIMA, and the like. In the algorithm, since $R_{TH}$ is fixed, only one model order reduction needs to be performed to get the poles and residues of Y(s):

$$Y(s) = \sum_{i=1}^{q} \frac{r_i}{s - p_i} \quad (23)$$

where q is the order, and $p_i$ and $r_i$ are the ith pole and residue of Y(s), respectively. The current flowing into the actual interconnect 809 is given by $$I_{actual}(t) = L^{-1}(I_{actual}(s)) = L^{-1}(V_{TH}(s)Y(s)) \quad (24)$$

where $L^{-1}$ is the inverse Laplace Transform operator and $V_{TH}(s)$ is given in Eqn. (7). $I_{actual}(t)$ is $$I_{actual}(t) = \quad (25)$$

$$-P_k \sum_{i=1}^{q} \frac{r_i}{p_i} \left[ \frac{1 - e^{p_i t}}{t_r} u(t) - \left(\frac{1}{t_r} + \frac{1}{t_f}\right)(1 - e^{p_i(t-t_r)})u(t - t_r) + \right.$$

$$\left. \frac{1 - e^{p_i(t-t_r-t_f)}}{t_f} u(t - t_r - t_f) \right]$$

The actual average current is calculated as $$\overline{I_{actual}} = \frac{1}{\Delta t} \int_0^{\Delta t} I_{actual}(t) dt \quad (26)$$

Further derivation gives $$\overline{I_{actual}} = \frac{P_k}{\Delta t} \left\{ \sum_{i=1}^{q} \frac{r_i}{p_i} \right. \quad (27)$$

$$\left. \left[ -\frac{1}{t_r}\left(\Delta t + \frac{1 - e^{p_i \Delta t}}{p_i}\right) + \left(\frac{1}{t_r} + \frac{1}{t_f}\right)\left(\Delta t - t_r + \frac{1 - e^{p_i(\Delta t - t_r)}}{p_i}\right) \right] \right\}$$

By equating (21) with (27), one obtains 408

$$\overline{I}(C_{eff}) = \overline{I_{actual}} \quad (28)$$

An iterative method such as Newton-Raphson converges within a few iterations to solve the above equation for $C_{eff}$.

Given a noise pulse width $W_i$ 109 and peak $P_i$ 113 at the victim driver 110 input, the steps in the noise-driven effective capacitance algorithm (FIG. 5) are summarized as follows:

Initialize k as 0.
Set the initial effective capacitance $C_{eff}^{(k)}$ to be the total victim net capacitance $C_{total}$ 212.
Find the Thevenin resistance $R_{TH}$ 400 as the sensitivity of the output noise width 311 with respect to the total capacitance $C_{total}$ 212. The output noise width is found from noise rule $W_o$ 311, which is in the propagation noise rule look-up-table obtained from SPICE simulation of non-linear victim driver 301 or fast simulation of the simple behavioral model 303 of the driver.
Find the reduced-order poles and residues of driving point admittance Y(s) 401 (Eqn. (5)) and sink transfer function H(s) 402 (with similar form of Y(s) but different $p_i$'s and $r_i$'s) using known reduced order model reduction techniques such as AWE, SyPVL and PRIMA, etc.
Find additional noise rules $T_o^{(k)}$ 309, $\Delta t^{(k)}$ 310, $P_o^{(k)}$ 312 and $A_o^{(k)}$ 313 from look-up-table obtained from SPICE simulation of non-linear victim driver 301 or fast simulation of the simple behavioral model 303 of the driver.
Find Thevenin voltage source $V_{TH}^{(k)}$ parameters $t_r^{(k)}$ 501, $t_f^{(k)}$ 502, $P_k^{(k)}$ 503 and $t_0^{(k)}$ 500 by solving equations of 404, 405, 406 and 407.
For the present Thevenin voltage source $V_{TH}^{(k)}$, match the average current flowing into a new effective capacitance $C_{eff}^{(k+1)}$ to the average current flowing into the reduced order model of the interconnect by solving equation 408.
If $C_{eff}^{(k+1)}$ differs from $C_{eff}^{(k)}$, increment k by one and go to Step 5. Otherwise,
$C_{eff}$ converges. Calculate the victim sink voltage $V_{sink}(t)$ by way of an inverse Laplace Transform of 410.
Determine the output Thevenin resistance $R_{TH}$, voltage source $V_{TH} = V_{TH}^{(k)}$ and victim sink voltage $V_{sink}(t)$.
Stop.

It should be noted that the convergence 409 of the effective capacitance procedure falls into the following three scenarios:

Regular triangular Thevenin voltage source with $t_r > 0$, $t_f > 0$ and $P_k > 0$ and regular effective capacitance $C_{eff}$ where $0 < C_{eff} < C_{total}$.

Effective capacitance $C_{eff} = 0$ when $\overline{I_{actual}}$ is close to zero. In this case propagation noise is negligible and therefore one sets $P_k = 0$.

Thevenin voltage source having a very sharp rising transition with $t_r$ close to or equal to zero which corresponds to the case when Eqn. (18) has no non-zero solution for $t_r$. In this case, one specially chooses the two parameters $t_f > 0$ and $P_k > 0$ to match the output noise rules as follows:

$$V_c(\Delta t) = P_o \quad (29)$$

$$\int_0^{\infty} V_c(t) dt = A_{total} \approx P_o \Delta t / 2 + A_o \quad (30)$$

where Eqn (11) is to match the output noise peak, and Eqn (12) is to match the total output noise area. The analysis results using the noise-driven effective capacitance method follow hereinafter. The driving gates are precharacterized and the noise rules are stored in tables. The noise-driven effective capacitance algorithm is preferably implemented in C++.

The method is advantageously tested with two global netlists extracted from a high performance microprocessor corresponding to a 0.13 μm technology and a supply voltage of 1.2V. One netlist has inverters driving two 1 mm -long capacitively coupled lines, while the other has inverters driving two 5 mm -long lines with both capacitive and inductive coupling, with one line being the aggressor and the other being the victim. All the experiments are preferably run on an AIX machine with 1 GB memory.

TABLE 1

|   | Input noise | | Sink noise (SPICE) | | Sink noise ($C_{eff}$) | | | |
|---|---|---|---|---|---|---|---|---|
|   | $P_i$ | $W_i$ | $P_s$ | $A_s$ | $P_s$ | Err % | $A_s$ | Err % |
| RC | 0.86 | 0.025 | 0.3615 | 0.01133 | 0.3817 | 5.6% | 0.01226 | 8.2% |
|    | 0.86 | 0.100 | 0.8454 | 0.06973 | 0.8368 | 1.0% | 0.06661 | 4.5% |
|    | 0.86 | 0.200 | 1.0162 | 0.15006 | 1.0025 | 1.3% | 0.14210 | 5.3% |
|    | 0.63 | 0.025 | 0.1509 | 0.00444 | 0.1590 | 5.4% | 0.00463 | 4.3% |
|    | 0.63 | 0.100 | 0.3531 | 0.02415 | 0.3672 | 4.0% | 0.02490 | 3.1% |
|    | 0.63 | 0.200 | 0.4790 | 0.05487 | 0.4896 | 2.2% | 0.05685 | 3.6% |
|    | 0.48 | 0.025 | 0.0711 | 0.00205 | 0.0717 | 0.8% | 0.00204 | 0.5% |
|    | 0.48 | 0.100 | 0.1328 | 0.00903 | 0.1376 | 3.6% | 0.00921 | 2.0% |
|    | 0.48 | 0.200 | 0.1602 | 0.01866 | 0.1667 | 4.1% | 0.01974 | 5.8% |
|    | 0.35 | 0.025 | 0.0303 | 0.00085 | 0.0302 | 0.3% | 0.00084 | 1.2% |
|    | 0.35 | 0.100 | 0.0533 | 0.00350 | 0.0543 | 1.9% | 0.00355 | 1.4% |
|    | 0.35 | 0.200 | 0.0613 | 0.00704 | 0.0623 | 1.6% | 0.00739 | 5.0% |
| RLC | 0.86 | 0.025 | 0.2943 | 0.01349 | 0.2919 | 0.8% | 0.01444 | 7.0% |
|    | 0.86 | 0.100 | 0.6194 | 0.06260 | 0.6694 | 8.1% | 0.06964 | 11.2% |
|    | 0.86 | 0.200 | 0.9249 | 0.14409 | 0.9058 | 2.1% | 0.14219 | 1.3% |
|    | 0.63 | 0.025 | 0.1206 | 0.00516 | 0.1182 | 2.0% | 0.00544 | 5.4% |
|    | 0.63 | 0.100 | 0.2598 | 0.02279 | 0.2691 | 3.6% | 0.02676 | 17.4% |
|    | 0.63 | 0.200 | 0.3862 | 0.05064 | 0.4188 | 8.4% | 0.05709 | 12.7% |
|    | 0.48 | 0.025 | 0.0474 | 0.00213 | 0.0482 | 1.7% | 0.00215 | 0.9% |
|    | 0.48 | 0.100 | 0.0955 | 0.00878 | 0.0977 | 2.3% | 0.00948 | 8.0% |
|    | 0.48 | 0.200 | 0.1332 | 0.01810 | 0.1441 | 8.2% | 0.01966 | 8.6% |
|    | 0.35 | 0.025 | 0.0190 | 0.00085 | 0.0196 | 3.2% | 0.00086 | 1.2% |
|    | 0.35 | 0.100 | 0.0377 | 0.00343 | 0.0380 | 0.8% | 0.00358 | 4.4% |
|    | 0.35 | 0.200 | 0.0514 | 0.00692 | 0.0547 | 6.4% | 0.00728 | 5.2% |

Table 1 shows the sink propagation noise (without coupling) comparison between the $C_{eff}$ method and SPICE. $P_i$ and $W_i$ are input noise peak (V) and width (ns). $P_s$ and $A_s$ are the sink noise peak (V) and area (V×ns).

TABLE 2

|   | Input noise | | Sink noise (SPICE) | | Sink noise ($C_{eff}$) | | | |
|---|---|---|---|---|---|---|---|---|
|   | $P_i$ | $W_i$ | $P_s$ | $A_s$ | $P_s$ | Err % | $A_s$ | Err % |
| RC | 0.86 | 0.025 | 0.5921 | 0.02131 | 0.534 | 9.8% | 0.0186 | 12.7% |
|    | 0.86 | 0.100 | 1.0551 | 0.08338 | 0.989 | 6.3% | 0.0730 | 12.4% |
|    | 0.86 | 0.200 | 1.2019 | 0.16232 | 1.154 | 4.0% | 0.1485 | 8.5% |
|    | 0.63 | 0.025 | 0.3569 | 0.01263 | 0.337 | 5.6% | 0.0132 | 4.5% |
|    | 0.63 | 0.100 | 0.5924 | 0.03749 | 0.545 | 8.0% | 0.0335 | 10.6% |
|    | 0.63 | 0.200 | 0.7191 | 0.07108 | 0.668 | 7.1% | 0.0655 | 7.9% |
|    | 0.48 | 0.025 | 0.2441 | 0.00900 | 0.246 | 0.8% | 0.0103 | 14.4% |
|    | 0.48 | 0.100 | 0.3319 | 0.01799 | 0.312 | 6.0% | 0.0174 | 3.3% |
|    | 0.48 | 0.200 | 0.3698 | 0.02920 | 0.341 | 7.8% | 0.0280 | 4.1% |
|    | 0.35 | 0.025 | 0.1874 | 0.00728 | 0.183 | 2.3% | 0.0073 | 0.3% |
|    | 0.35 | 0.100 | 0.2164 | 0.01038 | 0.208 | 3.9% | 0.0100 | 3.7% |
|    | 0.35 | 0.200 | 0.2266 | 0.01418 | 0.216 | 4.7% | 0.0138 | 2.7% |
|    | 0.12 | 0.025 | 0.1514 | 0.00622 | 0.162 | 7.0% | 0.0072 | 15.8% |
|    | 0.12 | 0.100 | 0.1524 | 0.00638 | 0.165 | 8.3% | 0.0074 | 16.0% |
|    | 0.12 | 0.200 | 0.1527 | 0.00656 | 0.165 | 8.1% | 0.0076 | 15.9% |
| RLC | 0.86 | 0.025 | 0.6092 | 0.03000 | 0.6064 | 0.5% | 0.03071 | 2.4% |
|    | 0.86 | 0.100 | 0.9724 | 0.08334 | 0.9838 | 1.2% | 0.08592 | 3.1% |
|    | 0.86 | 0.200 | 1.2724 | 0.16873 | 1.2202 | 4.1% | 0.15847 | 6.1% |
|    | 0.63 | 0.025 | 0.4730 | 0.02364 | 0.4412 | 6.7% | 0.02410 | 1.9% |
|    | 0.63 | 0.100 | 0.5822 | 0.04046 | 0.5920 | 1.7% | 0.04542 | 12.3% |
|    | 0.63 | 0.200 | 0.7374 | 0.07270 | 0.7417 | 0.6% | 0.07575 | 4.2% |
|    | 0.48 | 0.025 | 0.3828 | 0.01934 | 0.3737 | 2.4% | 0.02165 | 11.9% |
|    | 0.48 | 0.100 | 0.4129 | 0.02559 | 0.4233 | 2.5% | 0.02898 | 13.2% |
|    | 0.48 | 0.200 | 0.4581 | 0.03597 | 0.4697 | 2.5% | 0.03915 | 8.8% |
|    | 0.35 | 0.025 | 0.3393 | 0.01750 | 0.3349 | 1.3% | 0.01736 | 0.8% |
|    | 0.35 | 0.100 | 0.3535 | 0.02000 | 0.3533 | 0.1% | 0.02007 | 0.4% |
|    | 0.35 | 0.200 | 0.3689 | 0.02374 | 0.3699 | 0.3% | 0.02377 | 0.1% |
|    | 0.12 | 0.025 | 0.3161 | 0.01647 | 0.3172 | 0.3% | 0.01702 | 3.3% |
|    | 0.12 | 0.100 | 0.3164 | 0.01658 | 0.3191 | 0.9% | 0.01720 | 3.7% |
|    | 0.12 | 0.200 | 0.3169 | 0.01677 | 0.3196 | 0.9% | 0.01740 | 3.8% |

Table 2 illustrates the sink total coupling and propagation noise comparison between the $C_{eff}$ method and SPICE. $P_i$ and $W_i$ are input noise peak (V) and width (ns). $P_s$ and $A_s$ are the sink noise peak arrival and the aggressor switching signal.

TABLE 3

|   | Input peak (V) | Input width (ns) | Total cap (pF) | Effective cap (pF) | Num itr |
|---|---|---|---|---|---|
| RC | 0.86 | 0.025 | 0.20 | 0.127 | 5 |
|    | 0.86 | 0.100 | 0.20 | 0.171 | 3 |
|    | 0.86 | 0.200 | 0.20 | 0.184 | 3 |
|    | 0.63 | 0.025 | 0.20 | 0.121 | 5 |
|    | 0.63 | 0.100 | 0.20 | 0.169 | 3 |
|    | 0.63 | 0.200 | 0.20 | 0.182 | 3 |
|    | 0.48 | 0.025 | 0.20 | 0.117 | 5 |
|    | 0.48 | 0.100 | 0.20 | 0.169 | 3 |
|    | 0.48 | 0.200 | 0.20 | 0.184 | 3 |
|    | 0.35 | 0.025 | 0.20 | 0.113 | 5 |
|    | 0.35 | 0.100 | 0.20 | 0.169 | 3 |
|    | 0.35 | 0.200 | 0.20 | 0.184 | 3 |
|    | 0.12 | 0.025 | 0.20 | 0.000 | 1 |
|    | 0.12 | 0.100 | 0.20 | 0.172 | 3 |
|    | 0.12 | 0.200 | 0.20 | 0.186 | 2 |
| RLC | 0.86 | 0.025 | 0.89 | 0.266 | 6 |
|    | 0.86 | 0.100 | 0.89 | 0.480 | 5 |
|    | 0.86 | 0.200 | 0.89 | 0.698 | 4 |
|    | 0.63 | 0.025 | 0.89 | 0.245 | 6 |
|    | 0.63 | 0.100 | 0.89 | 0.477 | 5 |
|    | 0.63 | 0.200 | 0.89 | 0.678 | 4 |
|    | 0.48 | 0.025 | 0.89 | 0.237 | 5 |
|    | 0.48 | 0.100 | 0.89 | 0.488 | 4 |
|    | 0.48 | 0.200 | 0.89 | 0.706 | 3 |
|    | 0.35 | 0.025 | 0.89 | 0.222 | 6 |
|    | 0.35 | 0.100 | 0.89 | 0.491 | 4 |
|    | 0.35 | 0.200 | 0.89 | 0.731 | 3 |
|    | 0.12 | 0.025 | 0.89 | 0.001 | 1 |
|    | 0.12 | 0.100 | 0.89 | 0.532 | 3 |
|    | 0.12 | 0.200 | 0.89 | 0.794 | 3 |

Table 3 shows the total wiring capacitance versus the effective capacitance "seen" by the driving gate at different input noise widths and heights. As expected, all the effective capacitance remains between zero and the total wiring capacitance. For both the RC and RLC nets, the effective capacitance corresponding to the input pulses with $P_i$=0.12 and $W_i$=0.025 is zero or close to zero because the average current flowing out of the driving gate is zero or close to zero. In the experiments, convergence was seen to be achieved within 6 iterations.

EXAMPLE

Figure 10:
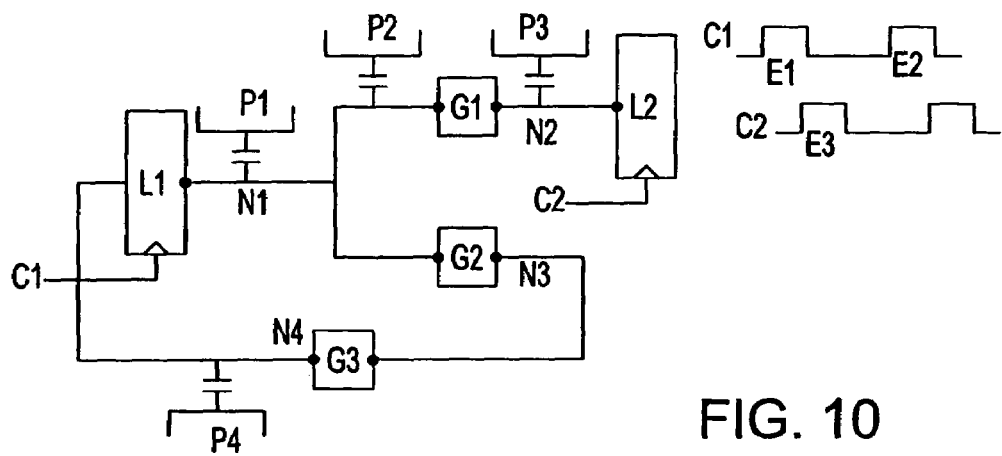
FIG. 10 shows a circuit typically found in a digital VLSI chip that illustrates various aspects of the present invention

Referring now to FIG. 10, a circuit typicaly found in a digital VLSI chip is shown and will be used to illustrate various aspects of the invention.

L1 and L2 are latches and G1, G2, and G3 are combinational logic gates. RLC wires N1, N2, N3, and N4 interconnect the latches and the gates with each other. L1 is clocked by clock C1, and L2 by clock C2. The clocking scheme is shown to the right of the figure. Data is launched from latch L1 at the edge E1 of C1, and after passing through gate G1, it is captured by latch L2 at clock edge E3 of C2. Simultaneously, the data after passing through G2 and G3 is captured by latch L1 at the edge E2 of C1. Also shown, are wires that run adjacent to N1, N2 and N4 denoted by P1, P2, P3 and P4, respectively. These adjacent wires have both capacitive and inductive coupling to N1, N2 and N4. Therefore, any signal transitions on these adjacent wires induce noise which interferes with the data launched by L1, forcing incorrect data to be captured at L1 and L2, which causes the chip to fail. The noise induced on the wire due to transitions on an adjacent wire are the aforementioned coupled noise and the noise that propagates to the output of the gate (i.e., the propagated noise). The invention which is preferably integral to the noise analysis tool determines the occurrence of such noise events which are accurately predicted, allowing corrective action be taken when necessary.

The method begins at the wire connected at the output of latch L1, i.e., N1.

1. The noise induced on N1 by adjacent wires (in this case P1 and P2) is computed at all the fan-out points of the wire. In the example, there are two fan-out points: the inputs to gate G1 and G2. Therefore, the coupled noise at the input to G1 and G2 are computed.
2. From the coupled noise computed at the input of G1 from step 1, the propagated noise is then computed at the output of G1.
3. From the noise at the output of G1, noise is then computed at the input of latch L2.
4. The coupled noise due to a signal transition at P3 is computed at the input of latch L2.
5. The coupled noise computed in step 4 is added to the propagated noise calculated in step 3.
6. If the total noise computed in step 5 is greater than a predetermined threshold (part of the design specification), and if the noise occurs within a certain window (part of the design specification) of the capture edge E3 of C2, a failure is flagged for a subsequent repair. Otherwise, no failure is flagged.
7. Similarly, the noise is propagated to the output of gate G2.
8. The propagated noise in step 7 is then used to compute the noise at the input of gate G3.
9. The noise computed in step 8 is propagated to the output of gate G3.
10. From the noise calculated in step 9, noise is computed at the input of L1.
11. The coupled noise at adjacent wire P4 due to a transition is computed at the input of L1.
12. The coupled noise from step 11 is added to the propagated noise computed at step 10.
13. If the total noise computed in step 12 is greater than a threshold (part of the design specification) and if the noise occurs within a certain window (part of the design specification) of the capture edge E2 of C1, a failure is flagged for subsequent repair. Otherwise, no failure is flagged.

Thus, the proposed invention identifies which latches fail due to noise before the chip is sent for fabrication. If any of the latches fail, then using the noise information from the tool, an appropriate repair strategy (not part of the invention) is implemented, such as rerouting the signal wires so that they are further apart.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

Thus, having described the invention, what is claimed is:

1. A method for minimizing noise problems in a chip design, said chip design comprising one or more nets, each net comprising at least one driver gate driving the net, one or more sinks receiving signals from the net, and a plurality of resistance (R) and capacitance (C) elements representing electrical properties of the net, said resistance being converted to capacitance only, said conversion to capacitance only comprising the steps of:
  i) setting a load C equal to the total interconnect wire C;
  ii) modeling the driver gate by replacing the driver with a Thevenin model;
  iii) determining an amount of electric charge sent into the victim net by said Thevenin model;
  iv) determining an equivalent C that consumes the same amount of electric charge as the amount of electric charge that was computed in step (iii); and
  v) repeating steps ii) through iv) until convergence of the value of the equivalent C is achieved, said updated C being a final equivalent C at the output of said driver gate,
the method comprising the steps of:
  a) identifying noise at inputs of the at least one driver gate and computing noise at an output thereof;
  b) propagating the computed noise at the output to all the sinks attached to said victim net;
  c) identifying nets coupled to said victim net and signal transitions on said coupled nets, and computing a coupled noise for all the sinks attached to said victim net;
  d) adding the computed propagation noise to the computed coupled noise;
  e) iteratively repeating steps a) through d) until a latch is reached; and
  f) determining if the noise at the latch input overlaps a signal clock, said overlap being indicative of a chip failure.

2. The method of claim 1, wherein step a) further comprises the steps of:
  a1) expressing the noise at the output of the victim driver gate in terms of the input noise and load capacitance; and
  a2) tabulating the input noise and the output capacitance to determine the output noise at the output of said driver gate.

3. The method of claim 1, wherein said victim driver driving said victim net comprised of said plurality of said sinks is analyzed based on input noise pulses characterized by their width, noise peaks, output load capacitances and propagation noise rules at an output of said victim driver.

4. The method of claim 3, wherein said noise rules are determined as a function of Thevenin's driver resistance.

5. The method of claim 1, wherein said Thevenin model consists of a Thevenin voltage and a driver linear Thevenin resistance, said driver linear Thevenin resistance being calculated by dividing an output noise width variance by a variance in output capacitance.

6. The method of claim 1, wherein for said victim net, a reduced order driving point admittance Y(s) and a transfer function H(s) of each of said victim sinks is determined by model order reduction (MOR) process.

7. The method of claim 6, wherein said admittance Y(s) computes the average current flowing into said victim net.

8. The method of claim 1, further comprising the step of computing a voltage waveform at each of said victim sink.

9. The method of claim 1, wherein said effective capacitance is obtained from a non-linear equation which extracts therefrom said driver Thevenin voltage source parameters of a rising transition time to peak.

10. The method of claim 9, wherein three of said Thevenin voltage source parameters are solved by way of three linear equations formed with said noise rules along with said Thevenin driver resistance and said effective capacitance.

11. The method of claim 10 wherein said effective capacitance is updated in order to match at least two average currents, and the convergence of said effective capacitance is determined to ascertain whether a second iteration is required if the updated effective capacitance differs from the present effective capacitance.

12. The method of claim 10 wherein the voltage of said victim sink is computed from said Thevenin voltage source and said transfer function H(s).

13. A program storage device readable by a machine, tangibly embodying a program of instructions executable by the machine to perform method steps for minimizing noise problems in a chip design, said chip design comprising one or more nets, each net comprising at least one driver gate driving the net, one or more sinks receiving signals from the net, and a plurality of resistance (R) and capacitance (C) elements representing electrical properties of the net, said resistance being converted to capacitance only, said conversion to capacitance only comprising the steps of:

i) setting a load C equal to the total interconnect wire C;

ii) modeling the driver gate by replacing the driver with a Thevenin model;

iii) determining an amount of electric charge sent into the victim net by said Thevenin model;

iv) determining an equivalent C that consumes the same amount of electric charge as the amount of electric charge that was computed in step (iii); and v) repeating steps ii) through iv) until convergence of the value of the equivalent C is achieved, said updated C being a final equivalent C at the output of said driver gate, the method comprising the steps of:

a) identifying noise at inputs of the at least one driver gate and computing noise at an output thereof;

b) propagating the computed noise at the output to all the sinks attached to said victim net;

c) identifying nets coupled to said victim net and signal transitions on said coupled nets, and computing a coupled noise for all the sinks attached to said victim net;

d) adding the computed propagation noise to the computed coupled noise;

e) iteratively repeating steps a) through d) until a latch is reached; and f) determining if the noise at the latch input overlaps a signal clock, said overlap being indicative of a chip failure.

* * * * *